(12) United States Patent
Oshima

(10) Patent No.: US 10,097,929 B2
(45) Date of Patent: Oct. 9, 2018

(54) SOUND SIGNAL AMPLITUDE SUPPRESSING APPARATUS

(71) Applicant: Large. inc, Tokyo (JP)

(72) Inventor: Kenichi Oshima, Tokyo (JP)

(73) Assignee: Large. inc, Tokyo (JP)

( * ) Notice: Subject to any disclaimer, the term of this patent is extended or adjusted under 35 U.S.C. 154(b) by 0 days.

(21) Appl. No.: 14/956,428

(22) Filed: Dec. 2, 2015

(65) Prior Publication Data
US 2016/0088404 A1 Mar. 24, 2016

Related U.S. Application Data

(63) Continuation of application No. PCT/JP2014/058601, filed on Mar. 26, 2014.

(30) Foreign Application Priority Data

Jun. 11, 2013 (JP) ................................. 2013-134290
Sep. 12, 2013 (JP) ................................. 2013-189417

(51) Int. Cl.
*H04B 15/00* (2006.01)
*H04R 25/00* (2006.01)
(Continued)

(52) U.S. Cl.
CPC ............. *H04R 25/356* (2013.01); *H03G 9/18* (2013.01); *H03G 11/02* (2013.01); *H03G 11/04* (2013.01);
(Continued)

(58) Field of Classification Search
CPC ... H03G 11/00; H03G 11/02; H03G 2201/106
See application file for complete search history.

(56) References Cited

U.S. PATENT DOCUMENTS 4,051,442 A * 9/1977 Yamazaki ............ H03G 1/0017
330/278
4,052,571 A * 10/1977 Gregory ............... H04R 25/356
333/14
(Continued)

FOREIGN PATENT DOCUMENTS

JP        S5475922 A    6/1979
JP      2001-320255 A   11/2001
(Continued)

OTHER PUBLICATIONS

ISR issued in international application No. PCT/JP2014/058601 dated Jul. 1, 2014.
(Continued)

*Primary Examiner* — Duc Nguyen
*Assistant Examiner* — Kile Blair
(74) *Attorney, Agent, or Firm* — Nath, Goldberg & Meyer; Jerald L. Meyer (57) ABSTRACT

When, in conventional sound systems, signals of sounds collected by a microphone are amplified and the amplified signals are applied to an ear by an earphone and a headphone, too loud sounds and environmental noises are unpleasant, and the intelligibility of words are poor. Hence, such problems are to be addressed. In addition, downsizing and performance improvement for sound apparatuses are to be accomplished. A signal having undergone an amplitude limitation with reference to an output potential of a high cut filter 17 which is an output by a low cut filter 12 in a high frequency band and inverted by an inverter 14 is added with, by an adder 15, an output signal from the high cut filter 17, and an addition signal is output.

3 Claims, 5 Drawing Sheets

(51) Int. Cl.
*H03G 11/02* (2006.01)
*H03G 11/04* (2006.01)
*H04R 1/10* (2006.01)
*H03G 9/18* (2006.01)

(52) U.S. Cl.
CPC ......... *H04R 1/1041* (2013.01); *H04R 25/353* (2013.01); *H04R 2225/43* (2013.01); *H04R 2430/01* (2013.01); *H04R 2430/03* (2013.01)

(56) References Cited

U.S. PATENT DOCUMENTS

| | | |
|---|---|---|
| 4,256,975 A | 3/1981 | Fukushima et al. |
| 4,327,331 A | 4/1982 | Yoshimi et al. |
| 4,571,548 A * | 2/1986 | Jordan .................. H03G 11/02 327/311 |
| 4,928,071 A | 5/1990 | Yamamoto et al. |
| 5,168,526 A | 12/1992 | Orban |
| 6,606,388 B1 * | 8/2003 | Townsend .............. G10H 1/125 381/1 |
| 8,238,578 B2 | 8/2012 | Aylward |
| 2012/0328127 A1 | 12/2012 | Ogasahara et al. |

FOREIGN PATENT DOCUMENTS

| | | |
|---|---|---|
| JP | 2006-197580 A | 7/2006 |
| JP | 2011-166652 A | 8/2011 |
| JP | 2012-151767 A | 8/2012 |

OTHER PUBLICATIONS

Japanese Office Action dated Oct. 25, 2016 corresponding to Application No. 2013-189417, with English translation.
European Search Report dated Dec. 23, 2016 issued in corresponding European Application No. 14811383.0.
First Office Action dated Feb. 3, 2017 in corresponding Taiwanese Patent Application No. 103119627.

\* cited by examiner

SOUND SIGNAL AMPLITUDE SUPPRESSING APPARATUS

CROSS-REFERENCE TO RELATED APPLICATIONS

This application is a Continuation of PCT Application No. PCT/JP2014/058601, filed on Mar. 26, 2014, and claims priority to Japanese Patent Application No. 2013-134290, filed on Jun. 11, 2013 and Japanese Patent Application No. 2013-189417, filed on Sep. 12, 2013, the entire contents of both of which are incorporated herein by reference.

TECHNICAL FIELD

The present invention relates to a sound signal amplitude suppressing apparatus that converts sound signals into signals suitable for a sound reproduction by earphone and headphone. That is, the present invention relates to a technology which processes sound signals into a form which has little load to ears and sound reproducing apparatuses, and which is capable of obtaining reproduced sounds with an excellent intelligibility.

BACKGROUND

When sounds collected by microphone are directly heard through a sound reproducing apparatus that utilizes an earphone and a headphone, there are problems such that a large amplitude signal and noises to be heard are too loud, an articulation is low in the case of a reproduction of words, and, a cooped-up feeling and a feeling of oppression are accompanied. Hence, for the problem associated with a large amplitude, the inventor of the present invention has proposed an amplitude limiting apparatus and an amplitude suppressing apparatus which have little reduction of the reproduced sound quality (see Patent Documents 1 to 3). Since distortion signal components that make an auditory sense unpleasant (the major cause in the distortion of reproduced sounds that makes the auditory sense unpleasant is a frequency component of equal to or higher than substantially 4 KHz) are generated together with an operation, those apparatuses include a function that eliminates or reduces such distortion signal components.

According to such a scheme, however, there is a technical limitation for a performance which eliminates undesired signal components while leaving necessary signal components, and there is a difficulty for surely maintaining an excellent frequency characteristic at a high frequency band. In addition, effects for technical problems, such as noises, articulation, cooped-up feeling and feeling of oppression, are still insufficient. Still further, those technologies have a non-practical aspect from the standpoint of an apparatus that does not need a high frequency signal.

Conventionally, the reasons for noises, cooped-up feeling, feeling of oppression, and low articulation of words, etc., in the case of sound reproduction by earphone and headphone have been unknown. Hence, there has been no direct solution, and this is an important technical problem in hearing aids, recorders, and the like (some hearing aid products have a function of eliminating noises, but the foregoing problems are not addressed by this elimination function).

The inventor of the present invention found the followings through the development procedures of hearing aids. That is, the sensitivity of an ear changes in accordance with environmental sounds with a high frequency (a high-frequency component generally thought as environmental noises). When such environmental sounds are large or intensive, the sensitivity of an ear decreases, and when such sounds are not intensive, the sensitivity of an ear increases. Hence, when sounds that have only such environmental sounds eliminated or suppressed are applied to an ear, low-tone frequency sounds are awkwardly heard as being too loud, causing the cooped-up feeling and the feeling of oppression.

In addition, high-frequency environmental sounds remarkably affect spaciousness and realistic sensation. It has been known that sounds from a bone-conduction headphone are easily hearable when an earplug is simultaneously utilized. This is because the earplug blocks off high-frequency environmental sounds and thus the sensitivity of an ear increases. Still further, earphones and headphones that have a function of causing surrounding sounds to be difficult to hear (in general, called noise-cancel earphones) are becoming popular. When such a function is activated, a user may get a cooped-up feeling. This is because that environmental sounds, in particular, high-frequency environmental sounds become not hearable.

When words collected by microphone are reproduced with an excellent frequency characteristic using an earphone and a headphone, and a sound volume is changed, an intelligibility of the words also changes. In addition, when the sound volume changes from loud to mute, there is a point at which environmental sounds are suddenly felt as being soft although the sound-volume feeling of words substantially remains the same. Around this point, the intelligibility becomes the maximum. It is though that this phenomenon has a close relationship with an ear that has an excellent ability of making out words under noises.

Sound signals in television and radio broadcasting, or from commercially available music software, etc., are subjected to an amplitude limitation. The major purpose is to avoid a technical problem due to an insufficient performance of sound apparatuses. This amplitude limitation brings a preferable effect for reproduction by earphone and headphone in low-tone frequencies. However, as for high-tone frequencies, the amplitude limitation effective for reproduction by earphone and headphone is not performed. Hence, when such signals are to be heard using an earphone and a headphone that have a flat frequency characteristic, high-tone sounds are heard as being too intensive. It is thought that an ear of a well-conditioned person performs a suitable amplitude limitation on incoming sounds, but the mechanism and the reason why this amplitude limitation ability is deactivated when an earphone and a headphone are utilized are still unclear.

In order to reproduce sounds by earphone and headphone to be hearable with a natural sound quality, it is important to perform a suitable amplitude limitation to entire frequency band of sounds, and to maintain a uniform gain characteristic throughout all frequencies relative to signals within an amplitude limitation value. According to conventional systems that utilize an earphone and a headphone, however, since the gain characteristic is not flat, high-frequency sounds are to be heard at a certain sound volume. That is, normal earphones and headphones are manufactured to have a low high-tone sensitivity. This is convenient for the easiness of the manufacturing of earphones, and high-tone sounds are also heard so as not to be too intensive. However, the high-tone frequency gain of such reproduced sound is insufficient, and thus environmental sounds are not hearable appropriately.

Consequently, reproduced sounds by earphone and headphone are likely to bring an unpleasant feeling. Problems such that "noises are unpleasant and words from a distant sound source are not hearable when a hearing aid is used", and "when recorded sounds are reproduced, words from a distant sound source are not hearable" are due to the low high-frequency gain of an earphone and that of a headphone. That is, this technical problem does not occur when a suitable amplitude limitation for reproduction by earphone and headphone, and, a reproduction with a uniform gain characteristic throughout all frequencies are performed.

In the case of sound reproduction by speaker, words from a distant sound source are hard to hear like the case of earphones, although there should be no problem in the case of sound reproduction by speaker without an amplitude limitation. This may be because of a remarkable difference between the reproduced sound field by speaker radiation and a sound field at the time of recording. Conversely, in the case of reproduction by earphone and headphone, sound waves similar to those at the time of recording are applicable to an ear, and thus the sound quality is excellent in comparison with a sound reproduction by speaker. However, there are many technical problems due to the above-explained reasons.

RELATED TECHNICAL DOCUMENTS

Patent Documents

Patent Document 1: JP 4825427 B
Patent Document 2: JP 4976012 B
Patent Document 3: JP 2011-166652 A

SUMMARY

According to conventional sound systems that reproduce sounds by earphone and headphone, when signals of sounds collected by microphone are directly amplified and applied to an ear, too loud sounds and environmental noises are unpleasant, and the intelligibility of a word is low. Hence, those problems are to be addressed. In addition, sound reproduction signals that utilize the performance of an apparatus highly efficiently are to be created.

The present invention performs an amplitude limitation or an amplitude suppression through a scheme that has little information loss in a low-tone frequency band, and maintains a high frequency or performs a slice scheme amplitude limitation, cutting, or addition of a pseudo sound. More specifically, the following features are employed.

In the present invention, an amplitude suppressing apparatus means both an apparatus which limits an amplitude within a constant range and which cuts an amplitude that is out of the range, and an apparatus that attenuates and outputs an input signal with a large value without cutting a signal component out of the range.

According to the present invention, in sound apparatuses that utilize an earphone and a headphone, reproduced sounds which have little load to an ear and which have a high intelligibility with a natural sound quality are obtainable. Hence, the performance of hearing aids and that of recorders are remarkably improved. In addition, a relative large sound volume is obtainable through a small-output sound apparatus, and thus the present invention has a remarkable effect for downsizing and performance improvement of sound apparatuses.

DESCRIPTION OF EMBODIMENTS

Embodiments of the present invention will be explained below in detail.

1. First Embodiment

Figure 1A:
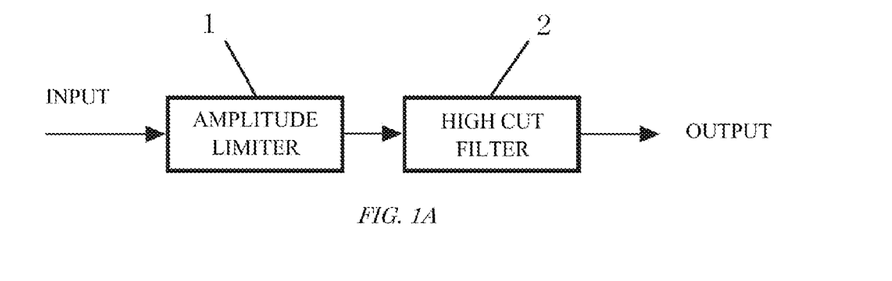
FIGS. 1A and 1B illustrate a first embodiment of the present invention, and are respectively an entire block diagram, and a circuit diagram illustrating a structure of an amplitude limiter.

FIG. 1A is a block diagram for a first embodiment of the present invention. This invention is quite useful for an apparatus (e.g., a telephone) that does not need a high-frequency signal. An amplitude suppressing apparatus of this embodiment includes an amplitude limiter 1 into which a sound signal is input, and a high cut filter 2 which is connected to the output side of the amplitude limiter, and which outputs the sound signal having undergone an amplitude limitation.

The amplitude limiter 1 is equivalent to the amplitude limiter which is applied in FIG. 10 of Japan Patent No. 4976012 and is partially applied in JP 2011-166652 A. That is, this is an amplitude limiter (hereinafter, referred to as a bias-shift scheme amplitude limiter) that performs an amplitude limitation by shifting an operation reference potential, i.e., a bias potential in the opposite direction corresponding to, when an amplitude exceeds a certain level, the exceeding amplitude value, and is a circuit that employs a principle illustrated in FIG. 1B.

Figure 1B:
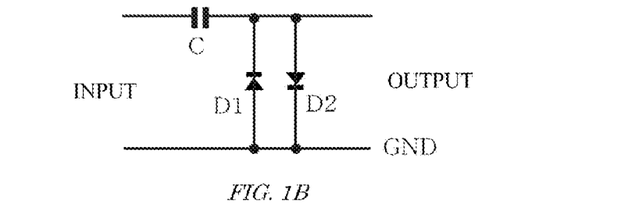

In FIG. 1B, in an initial condition in which no input signal is given, the DC potential of a cathode of a diode D1 or that of an anode of a diode D2 is 0 V that is equal to GND. When, however, an amplitude signal that is larger than a forward voltage of the diode D1 or the diode D2 is input to the input side, a current flows through the diode D1 or D2 and a capacitor C, and thus the amplitude of an output signal is limited, while at the same time, the capacitor C is charged. This charging operation generates a voltage across both terminals of the capacitor C. Next, this voltage serves as a bias voltage for a circuit at the output side. That is, the bias voltage of the output-side circuit is changed by a large input signal, and thus an amplitude limitation is performed. According to this amplitude limiting scheme, although information loss corresponding to the exceeding part from the limited amplitude is little, an amount of distortion signals to be generated which deteriorate a reproduced sound quality is large.

The high cut filter 2 eliminates, from the output signal from the amplitude limiter 1, high-frequency components. Hence, when, for example, signal components with frequencies higher than 4 KHz are to be eliminated by the high cut filter 2, the output signal from the high cut filter 2 does not contain signal components that remarkably deteriorate a reproduced sound quality (the major cause in sound distortion that makes an ear unpleasant is a frequency component of equal to or higher than substantially 4 KHz). However, frequency components lower than 4 KHz in the input signal are directly output. Accordingly, although the structure is simple, this structure is practical for apparatuses that do not need a signal of equal to or higher than 4 KHz.

When a slice scheme amplitude limiter that does not strictly affect the sound quality is provided in a preceding stage of this circuit, an amount of unpleasant sound signals to be generated at the bias-shift scheme amplitude limiter is reduced. That is, when a bias-shift scheme amplitude limitation is performed on a signal that contains a signal component which has a large fluctuating amplitude value, a large signal that causes unpleasant sounds is generated at random, and this large signal is not likely to be eliminated at the subsequent stage that is the high cut filter since the generation of such a signal is at random. When, however, a bias-shift scheme amplitude limitation is performed on a signal that have large signal levels arranged uniformly by a slice scheme amplitude limitation, the bias shift is performed by the same level in the opposite directions with each other, and thus signal components that cause unpleasant sounds are efficiently eliminated by the subsequent stage that is the high cut filter.

The operation and the effect become slightly different, but when the connection relationship between the amplitude limiter 1 and the high cut filter 2 is reversed, i.e., when the amplitude limiter 1 is connected to the output side of the high cut filter 2, similar effects are accomplishable.

2. Second Embodiment

Figure 2:
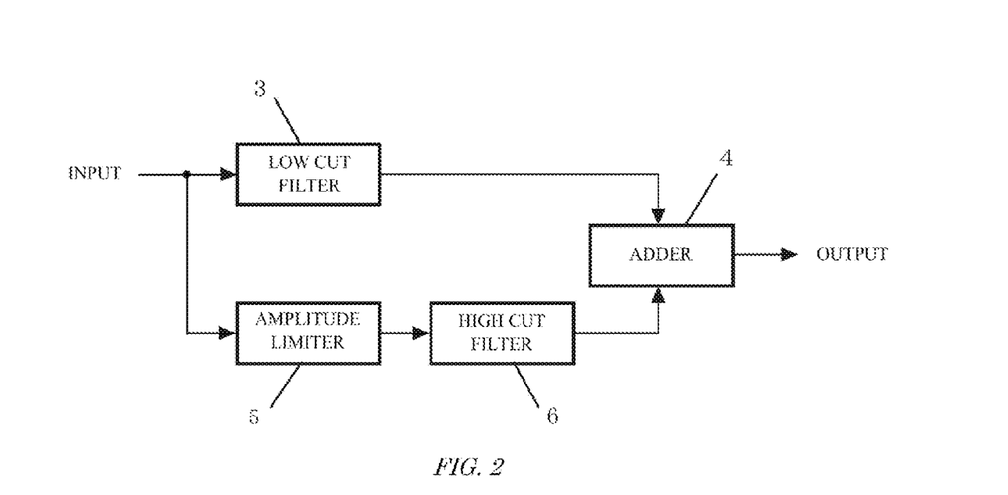
FIG. 2 is a block diagram for a second embodiment of the present invention.

FIG. 2 is a block diagram for a second embodiment of the present invention, and this embodiment is quite useful when it is desirable to obtain reproduced sounds as large as possible by a sound system that includes a small-output amplifier and a downsized speaker.

The second embodiment employs the structure shown in FIG. 1 to which a low cut filter 3 and an adder 4 are added. That is, an input signal is supplied to both of the low cut filter 3 and an amplitude limiter 5. A high cut filter 6 is connected to the output side of the amplitude limiter 5. The output from the low cut filter 3 and the output from the high cut filter 6 are added together through the adder 4. Hence, the adder 4 outputs an addition signal.

The structure illustrated in FIG. 1 is not suitable for apparatuses for music, etc., that need high-frequency signals, but according to this embodiment, since high-frequency signal components are not to be eliminated, an excellent frequency characteristic for music is accomplishable.

According to this embodiment employing the above structure, the low cut filter 3 takes out, from the input signal, only high-frequency signal components. Next, the high-frequency signal components are added to, by the adder 4, a low-tone signal generated by the amplitude limiter 5 and the high cut filter 6.

Since the low cut filter 3 has no factor that causes sounds to be distorted, the output signal from the low cut filter 3 contains no signal component that deteriorates the reproduced sound quality. In addition, the output from the high cut filter 6 contains no signal component that remarkably deteriorates the reproduced sound quality. Hence, the output signal from the adder 4 obtained by adding those two signal components contains no signal component that remarkably deteriorates the reproduced sound quality.

According to this structure, since the amplitude of a high-frequency signal that is output from the adder 4 is not subjected to an amplitude limitation, when the amplitude limiter 5 and the high cut filter 6 which form a low-tone circuit perform a strictly intensive amplitude limitation, there is a disadvantage that the amplitude of a high-tone signal becomes relatively large to the low-tone signal. In the case of average sound signals, however, the amplitude of a high-frequency signal is small. Hence, when applied to not so intensive amplitude limitation, the structure that does not perform an amplitude limitation on a high-frequency signal falls in a practical range.

3. Third Embodiment

Figure 3A:
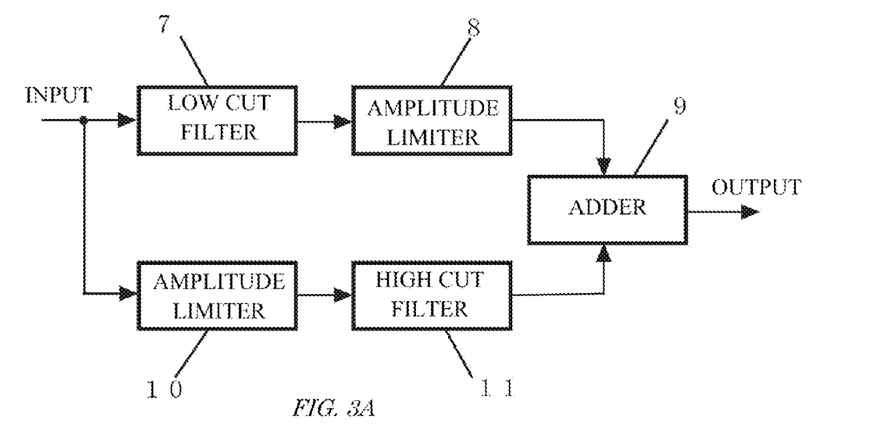
FIGS. 3A and 3B illustrate a third embodiment of the present invention, and are respectively an entire block diagram, and a block diagram (partially a circuit diagram) for a structure to which an amplitude limiter is added at the subsequent stage of an adder according to the third embodiment.

FIG. 3A is a block diagram for a third embodiment of the present invention, and this embodiment is quite useful for sound apparatuses that reproduce sounds mainly by earphone and headphone, such as a hearing aid and a recorder.

This embodiment employs the structure of the second embodiment to which an amplitude limiter 8 is added at the subsequent stage of the low cut filter 7 that constructs the high-tone circuit, and a disadvantage of the second embodiment that causes a high-frequency and large-amplitude input signal to directly appear in the output is addressed.

The amplitude limiter 8 performs an amplitude limitation on the output signal (high-tone frequency signal) from the low cut filter 7, and thus no excessive amplitude signal appears in the output from the adder 9. As for the amplitude limiter 8, a better result is obtainable with a general amplitude limiter (slice scheme) than the bias-shift scheme. This is because even if information corresponding to the exceeding part from the limit value is dissipated, an adverse effect to reproduced sounds is little in the case of high-frequency signals, and slice scheme amplitude limiters generate a little amount of distortion signals that deteriorate the reproduced sound quality than bias-shift scheme amplitude limiters. The reason why the process of high-frequency signals is performed separately from that of low-tone signals is if high-tone signals are processed by the same scheme as that of low-tone signals, an amount of distortions to be generated which results in unpleasant sounds is large.

It is appropriate in actual practice if the cut-off characteristic of the low cut filter 7 and that of the high cut filter 11 are not so sharp. This is because the unpleasant level originating from distortion signals generated by the bias-shift amplitude limiter gradually increases in proportional to the height of a frequency, and thus it is sufficient if the amplitude limiting scheme changes gently.

Figure 3B:
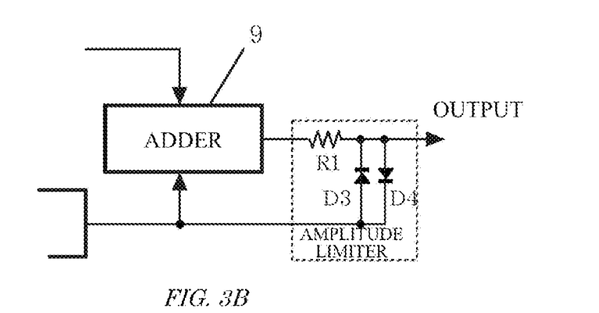

As illustrated in FIG. 3B, the slice scheme amplitude limiter 8 may be provided at the subsequent stage of the adder 9. In addition, it is desirable that the higher the signal frequency is, the smaller the value of the amplitude limitation to be controlled becomes. In order to obtain a signal with such a characteristic, it is effective if a signal with an emphasized high-tone frequency is input, and the high-tone of an output signal is attenuated.

4. Fourth Embodiment

Figure 4:
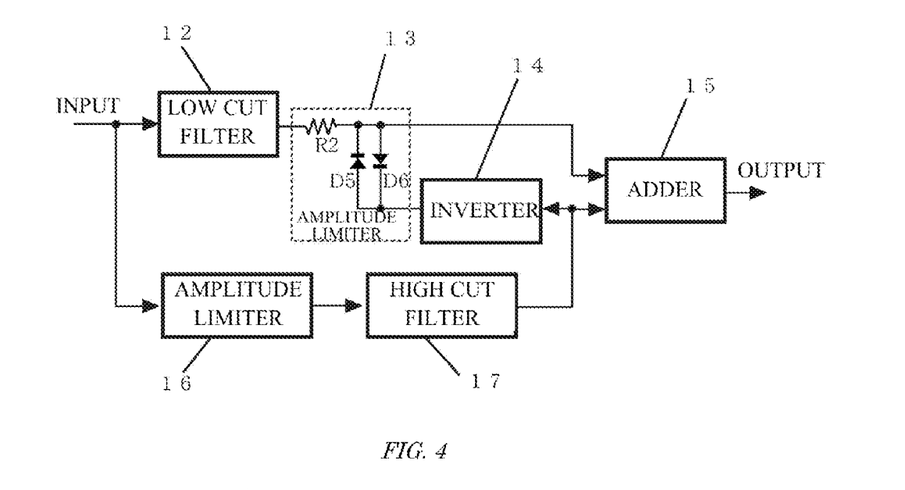
FIG. 4 is a block diagram (partially a circuit diagram) for a fourth embodiment of the present invention.

FIG. 4 is a block diagram (a partial circuit diagram) for a fourth embodiment of the present invention, and as similar to the third embodiment, this embodiment is quite useful for sound apparatuses that reproduce sounds mainly by earphone and headphone, such as a hearing aid and a recorder.

This embodiment employs the structure of the third embodiment to which an inverter 14 is added, and the inverter 14 takes out the output signal from a high cut filter 17 that is a low-tone circuit, inverts the taken-out signal, and supplies the inverted signal to the amplitude limitation reference potential circuit of an amplitude limiter 13 that is a high-tone circuit. That is, according to this embodiment, the output from the high cut filter 17 is divided to an adder 15 and the inverter 14, and the output side of the inverter 14 is connected to respective reference-voltage applied sides of parallel diodes D5, D6 that construct the amplitude limiter 13. According to this structure, the amplitude limiter 13 performs an amplitude limitation on a high-frequency-band signal output from the low cut filter 12 with reference to an inverted signal of a low-frequency-band signal output by the high cut filter 17 and having undergone an amplitude limitation.

Consequently, when the low-frequency-band signal from the high cut filter 17 has an amplitude that is large at the positive side, the limited amplitude of the high-frequency-band signal from the low cut filter 12 is controlled so as to be small at the positive side. Conversely, when the low-frequency-band signal from the high cut filter 17 has an amplitude that is large at the negative side, the limited amplitude of the high-frequency-band signal from the low cut filter 17 is controlled so as to be small at the negative side (a P-P value remains the same). Subsequently, the adder 15 adds the high-frequency-band signal having undergone the amplitude limitation by the amplitude limiter 13 with the low-frequency-band signal from the high cut filter 17, thereby outputting an addition signal.

According to the structure illustrated in FIG. 3, the amplitude value of the output signal from the adder 9 becomes the amplitude value of the output from the high cut filter 11+the amplitude value of the output from the amplitude limiter 8. That is, when the maximum output amplitude of the high cut filter 11 is consistent with the maximum output amplitude of the amplitude limiter 8, the maximum output amplitude of the adder 9 becomes twice as much as the maximum output amplitude of the high cut filter 11 or slightly larger because of a waveform deformation originating from an amplitude limitation. However, in view of the purpose of the amplitude limitation, it is preferable that the maximum amplitude value of the adder 9 should never exceed the maximum amplitude of the high cut filter 11. The inverter 14 in FIG. 4 is provided for this reason.

That is, when the output amplitude value of the high cut filter 17 changes, the amplitude limitation value of the amplitude limiter 13 changes in the opposite direction by the change value. Hence, the maximum output amplitude value of the adder 15 does not become equal to or higher than the maximum amplitude output value of the high cut filter 17. Therefore, the output signal according to this structure enables a sound apparatus to obtain large reproduced sounds although the maximum amplitude is small in comparison with FIGS. 3A and 3B. This is also preferable as a too-loud-sound suppressing characteristic. The output maximum amplitude in the case of FIGS. 3A and 3B becomes "the maximum output amplitude of the amplitude limiter 8+the maximum output amplitude of the high cut filter 11". In contrast, since the maximum output amplitude in the case of FIG. 4 never exceeds the maximum output amplitude of the high cut filter 17, the maximum output amplitude is limited so as to be smaller than that of the case in FIG. 3 without creating a large difference in the reproduced sound quality. That is, the amplitude limitation by the amplitude limiter 13 is dynamically controlled in such a way that the maximum amplitude of the adder 15 does not exceed the maximum amplitude value of the high cut filter 17.

5. Fifth Embodiment

Figure 5:
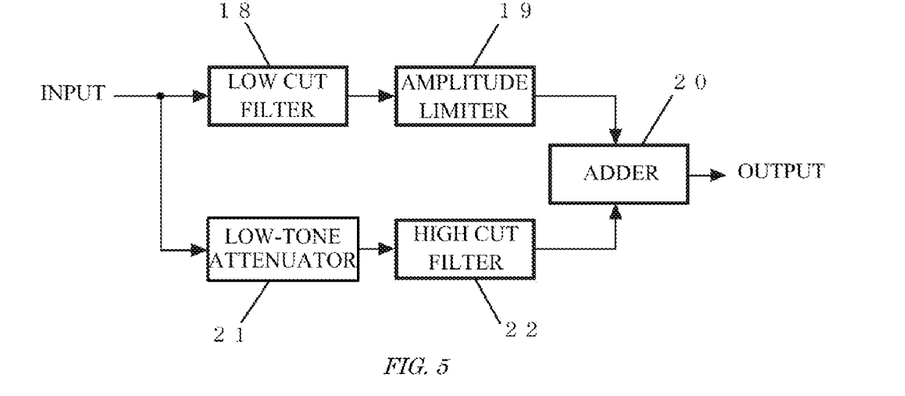
FIG. 5 is a block diagram for a fifth embodiment of the present invention.

FIG. 5 is a block diagram for a fifth embodiment of the present invention, and this embodiment is quite useful for sound apparatuses that reproduce sounds by earphone and headphone, in particular, a hearing aid like the third embodiment and the fourth embodiment.

This embodiment is a modified example of FIG. 3, and the amplitude limiter 10 in FIG. 3 is replaced with a low-tone attenuator 21. In view of the amplitude limiting effect, the structure in FIG. 3 accomplishes a better effect, but the structure in FIG. 5 is better from the standpoint of sound distortion.

In general, the lower a frequency is, the larger the amplitude of a sound wave becomes. Conversely, the higher the frequency is, the smaller the amplitude of the sound wave becomes. This difference is quite large. Hence, when a low-tone component is attenuated within a range that does not give an adverse effect to the sound quality, a considerable amplitude suppressing effect is obtainable. When a low-tone component is attenuated, in the case of sound reproduction by speaker radiation, a low-tone insufficiency occurs, but a preferable result is obtainable when sounds are reproduced near an eardrum like an earphone and a headphone. In addition, an insufficient gain for a high-tone frequency gives an adverse effect to the sensitivity characteristic, etc., of an ear, but such an adverse effect hardly occurs in the case of a low-tone frequency. Hence, it is acceptable in actual practice.

In the case of apparatuses that work together with a microphone like hearing aids, a microphone may have a function of the low-tone attenuator 21 (many bidirectional microphones have a low sensitivity for low tones).

6. Sixth Embodiment

Figure 6:
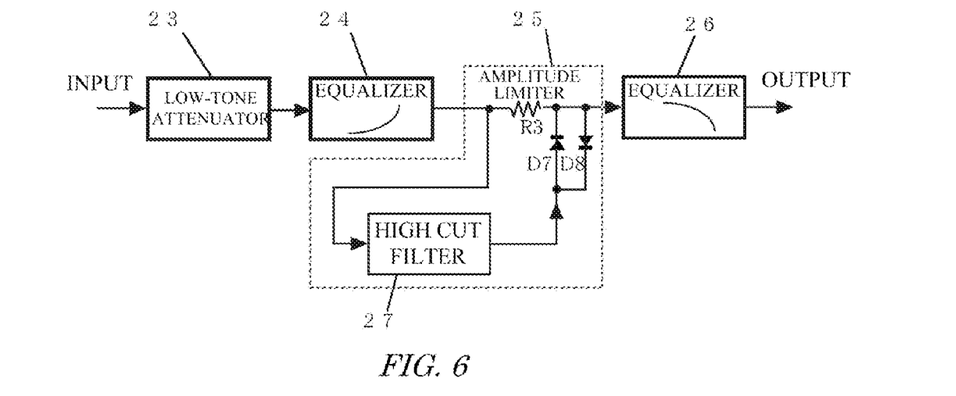
FIG. 6 is a block diagram (partially a circuit diagram) for a sixth embodiment of the present invention.

FIG. 6 is a block diagram (a partial circuit diagram) for a sixth embodiment of the present invention, and the same result is obtainable although the circuit structure is different from the circuit structure in FIG. 5. That is, an equalizer 24 for emphasizing high tones is connected to the output side of a low-tone attenuator 23, an amplitude limiter 25 is connected to the output side of this equalizer 24, and the output by the amplitude limiter 25 is supplied to the exterior through an equalizer 26 for attenuating high tones. The amplitude limiter 25 includes parallel diodes D5, D6 in opposite directions located at the subsequent stage of a resistor R3, and a high cut filter 27 connected in parallel with those resistor R3, and diodes D5, D6. The input side of the high cut filter 27 is connected to the output side of the equalizer 24 for emphasizing high tones, while the output side of the high cut filter 27 is connected to the respective reference-voltage applied sides of the diodes D5, D6.

The low-tone attenuator 23 of this embodiment performs a low-tone attenuation on an input signal, thereby obtaining an amplitude suppressing effect for low tones. The output signal from the low-tone attenuator 23 is input to the equalizer 24, and the equalizer 24 outputs a signal that has emphasized high tones.

The amplitude limiter 25 performs an amplitude limitation on high-frequency signals. The high cut filter 27 in the amplitude limiter 25 outputs a signal that is the input signal with high tones being cut off, and this output signal becomes an amplitude limitation reference potential for the amplitude limiter 25. That is, the amplitude limitation is performed in such a way that a difference that is equal to or larger than the forward voltage of the diode D5 or D6 is not output in comparison with the output potential by the high cut filter 27. Hence, the amplitude limiter 25 performs the amplitude limitation only on high-tone components.

The output signal from the amplitude limiter 25 is output through the equalizer 26. That is, the signal having undergone the high-tone emphasis by the equalizer 24 is subjected to the amplitude limitation by the amplitude limiter 25, and the high tones of this signal is attenuated by the equalizer. Hence, the output from the equalizer 26 becomes a signal having undergone an amplitude limitation in such away that the higher the frequency is, the smaller level this amplitude limitation becomes. When the low-tone attenuation characteristic of the low-tone attenuator 23 is accomplished by microphone, while the high-tone attenuation characteristic of the equalizer 26 is accomplished by an earphone or a headphone, a simplified circuit structure is obtainable.

7. Seventh Embodiment

Figure 7:
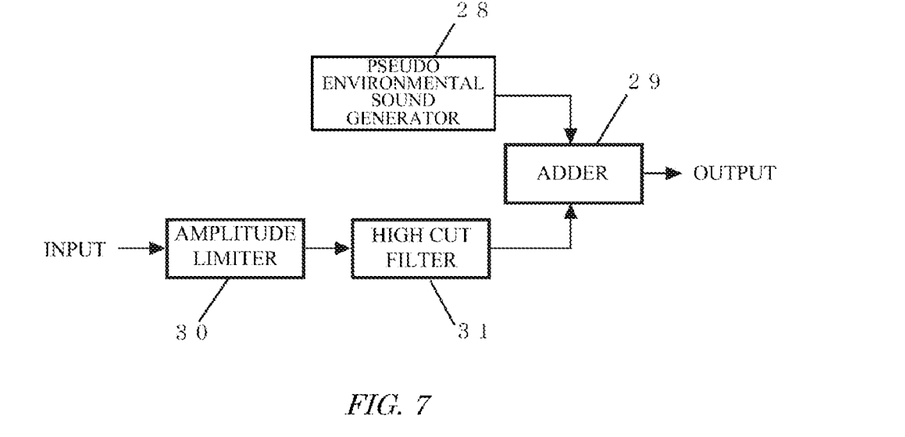
FIG. 7 is a block diagram for a seventh embodiment of the present invention.

FIG. 7 is a block diagram for a seventh embodiment of the present invention, and this embodiment is quite useful for downsized hearing aids, etc. This embodiment employs the structure in FIG. 1 to which a pseudo environmental sound generator 28 and an adder 29 are added. The pseudo environmental sound generator 28 electrically generates artificial environmental sound signals, or outputs environmental sound signals recorded under a different environment. The output signal from the pseudo environmental sound generator 28 and the output signal from a high cut filter G31 are added and output by the adder 29.

According to the structure in FIG. 1, in the case of sound reproduction by earphone and headphone, high-tone sounds are omitted, resulting in a cooped-up feeling and a feeling of oppression in some cases, but according to the structure of this embodiment, since the pseudo environmental sound generator 28 adds the environmental sound signals, such disadvantage is addressed.

Downsized hearing aids, etc., normally have a microphone disposed near an earphone, and thus a howling phenomenon is likely to occur. In addition, since a howling phenomenon is likely to occur at a high frequency rather than a low frequency, many downsized hearing aids have a small gain for high frequency. This is a cause for unpleasant sounds. According to the scheme of this embodiment, however, even if the gain for high frequency is not increased, a howling phenomenon is suppressed by the pseudo environmental sound generator 28 that adds environmental sounds, and pleasant hearing without a cooped-up feeling and a feeling of oppression is accomplishable. When a mechanism that changes the output level of the pseudo environmental sound generator 28 in proportional to the magnitude of the surrounding environmental noise level is employed, the pseudo environmental sound generator 28 is capable of automatically outputting a signal at a suitable level according to the environment.

8. Eighth Embodiment

Figure 8:
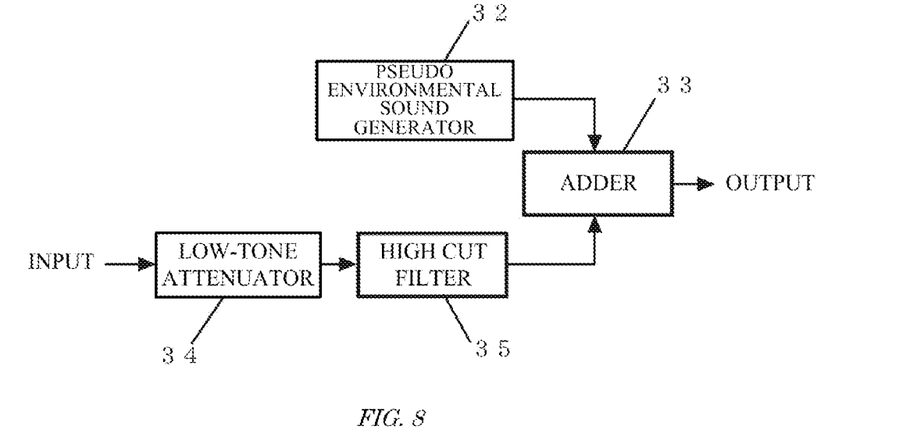
FIG. 8 is a block diagram for an eighth embodiment of the present invention.

FIG. 8 is a block diagram for an eighth embodiment of the present invention, and this embodiment is quite useful for downsized hearing aids like the embodiment in FIG. 7. This embodiment employs the structure in FIG. 7 in which the amplitude limiter 30 is replaced with a low-tone attenuator 34. Although the amplitude suppressing characteristic is less than that of the structure in FIG. 7, reproduced sounds with less distortion than that of the structure in FIG. 7 are obtainable. Even in the case of normal sound apparatuses that utilize an earphone and a headphone, when pseudo environmental sounds are added to the reproduced sounds, noises to be heard are reduced.

9. Ninth Embodiment

Figure 9:
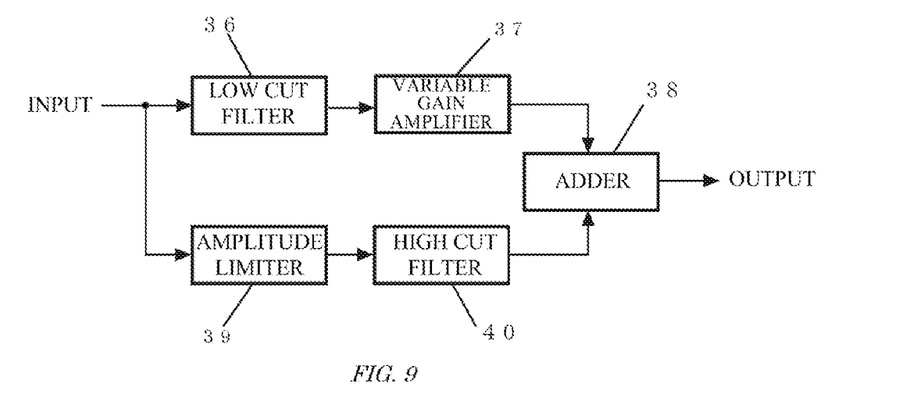
FIG. 9 is a block diagram for a ninth embodiment of the present invention.

FIG. 9 is a block diagram for a ninth embodiment of the present invention, and when this embodiment is applied to hearing aids, etc., and recorders, setting of the optimized intelligibility of sounds desired to hear is enabled. This embodiment employs the structure in FIG. 2 to which a variable gain amplifier 37 is added, and the variable gain amplifier 37 enables an adjustment of the level of a high-frequency signal. Since the sensitivity of an ear changes according to the intensity of high-frequency sounds, when the level of high-frequency sounds is changed, how the reproduced sounds are to be heard becomes changeable.

10. 10th Embodiment

Figure 10:
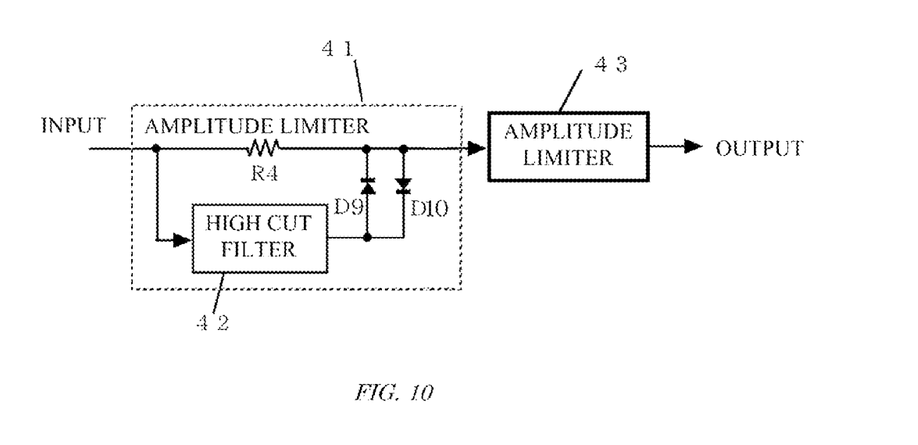
FIG. 10 is a block diagram for a 10th embodiment of the present invention.

FIG. 10 is a block diagram of a circuit that removes, with a relatively simple structure, a disadvantage of the structure in FIG. 1 that a high-frequency component is omitted. In this embodiment, two types of amplitude limiters 41, 43 are applied. The first amplitude limiter 41 has a high cut filter 42 built in the reference-voltage applied side as similar to the one applied in the sixth embodiment in FIG. 6. The first amplitude limiter 41 performs an amplitude limitation for a high-frequency range. The second amplitude limiter 42 performs an amplitude limitation for a low-frequency range.

According to the structure illustrated in FIG. 1, high-frequency distortion signal components causing unpleasant sounds are eliminated by the high cut filter 2, but the high cut filter 2 also eliminates high-frequency components contained in the original signal. Hence, the output signal lacks a high-frequency component.

As for the high-frequency distortion signal components generated in the case of the structure in FIG. 1, a large amount of such distortion signal components is generated when a bias-shift scheme amplitude limiter performs an amplitude limitation on high-frequency signal components in the original signal. Needless to say, such distortion signal components are also generated in the case of low-frequency signal components, but the amount is relatively small. Hence, when a signal obtained by a slice scheme amplitude limiter that performs a level limitation on high-frequency signal components in an input signal is input to a bias-shift scheme amplitude limiter, the output circuit takes out a signal which contains sufficient high-tone components of the original signal, and which contains little high-frequency distortion signal components.

An input signal is supplied to the amplitude limiter 41, and a low-frequency-band signal from the high cut filter 42 is taken as an operation reference voltage for diodes D9, D10, thereby performing a slice scheme amplitude limitation for high frequency (this operation is the same as the case of the amplitude limiter in FIG. 6). The output signal from the amplitude limiter 41 is input to the second amplitude limiter 43, and this amplitude limiter performs a bias-shift scheme amplitude limitation on low-tone signals. Since the level of the high-frequency signal input to this amplitude limiter 43 at this time is low, a signal with little high-frequency distortion signal components is obtainable for the output circuit of the amplitude limiter 43.

In the case of FIG. 10, although the characteristic is slightly deteriorated, a substantially equivalent output signal to that of FIG. 4 is obtainable with a simple structure. That is, when a bias-shift scheme amplitude limitation is performed on a high-frequency signal, a large amount of distortion signal components that are a cause of unpleasant reproduced sounds is generated. Hence, in FIG. 10, before the signal is input to the bias-shift scheme amplitude limiter, the slice scheme amplitude limitation is performed on the high-frequency signal. Consequently, no bias-shift scheme amplitude limitation is performed on the high-frequency signal, and thus distortion signal components that are a cause of unpleasant sounds are hardly generated. As for low-frequency signals, high-frequency distortion signal components to some level are generated by a bias-shift scheme amplitude limitation, and thus the sound quality is deteriorated by what corresponds to the generated distortion signal components. However, since such distortion is little, this circuit is sufficiently practical. In addition, when a high-tone frequency component emphasis for an input signal and a high-tone frequency component attenuation for an output signal are performed so as to perform an amplitude limitation in such a way that the higher the frequency signal is, the smaller the amplitude limitation becomes, the amount of high-frequency distortion signal components in the output signal is further reduced.

INDUSTRIAL APPLICABILITY

The present invention has a remarkable effect for improving the performance of downsized sound apparatuses and that of hearing aids.

REFERENCE SIGNS LIST

1 Amplitude limiter
2 High cut filter
3 Low cut filter
4 Adder
5 Amplitude limiter
6 High cut filter
7 Low cut filter
8 Amplitude limiter
9 Adder
10 Amplitude limiter
11 High cut filter
12 Low cut filter
13 Amplitude limiter
14 Inverter
15 Adder
16 Amplitude limiter
17 High cut filter
18 Low cut filter
19 Amplitude limiter
20 Adder
21 Low-tone attenuator
22 High cut filter
23 Low-tone attenuator
24 Equalizer
25 Amplitude limiter
26 Equalizer
27 High cut filter
28 Pseudo environmental sound generator
29 Adder
30 Amplitude limiter
31 High cut filter
32 Pseudo environmental sound generator
33 Adder
34 Low-tone attenuator
35 High cut filter
36 Low cut filter
37 Variable gain amplifier
38 Adder
39 Amplitude limiter
40 High cut filter
41 Amplitude limiter
42 High cut filter
43 Amplitude limiter
C Capacitor
R1, R2, R3, R4 Resistor
D1, D2, D3, D4, D5, D6, D7, D8, D9, D10 Diode

The invention claimed is:

1. A sound signal amplitude suppressing apparatus comprising amplitude limiters which a bias potential is applied to, the amplitude limiters comprising:
a first amplitude limiter, that is a bias-shift scheme amplitude limiter, shifting, when the amplitude of the input signal exceeds a predefined level, the bias potential in an opposite direction to a change in the amplitude, and performing an amplitude limitation on an output signal in accordance with the shifted bias potential; and
a second amplitude limiter, that is a slice scheme amplitude limiter, performing an amplitude limitation by eliminating an amplitude part exceeding a predefined value,
wherein:
the first amplitude limiter performs the amplitude limitation when the amplitude of the input signal exceeds the predefined level for the relatively low frequency component; and
the second amplitude limiter performs the amplitude limitation when the amplitude of the input signal exceeds the predefined value for the relatively high frequency component.

2. The sound signal amplitude suppressing apparatus according to claim 1, further comprising:
a low cut filter provided at a preceding stage of the second amplitude limiter;
a high cut filter provided at a subsequent stage of the first amplitude limiter; and
an adder adding an output from the second amplitude limiter to an output from the high cut filter.

3. The sound signal amplitude suppressing apparatus according to claim 1, further comprising:
a high cut filter provided at a subsequent stage of the first amplitude limiter;
a low cut filter provided parallel to the first amplitude limiter; and
an adder adding an output from the low cut filter to an output from the high cut filter, wherein
the second amplitude limiter is provided at a subsequent stage of the adder.

* * * * *